(12) United States Patent
Seo et al.

(10) Patent No.: US 10,236,442 B2
(45) Date of Patent: Mar. 19, 2019

(54) METHODS OF FORMING AN INTERCONNECTION LINE AND METHODS OF FABRICATING A MAGNETIC MEMORY DEVICE USING THE SAME

(71) Applicant: Samsung Electronics Co., Ltd., Suwon-Si, Gyeonggi-do (KR)

(72) Inventors: Jaehun Seo, Suwon-si (KR); Jong-Kyu Kim, Seongnam-si (KR); Jung-Ik Oh, Hwaseong-si (KR); Inho Kim, Suwon-si (KR); Jongchul Park, Seongnam-si (KR); Gwang-Hyun Baek, Seoul (KR); Hyun-woo Yang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 40 days.

(21) Appl. No.: 15/227,334

(22) Filed: Aug. 3, 2016

(65) Prior Publication Data
US 2017/0110656 A1    Apr. 20, 2017

(30) Foreign Application Priority Data

Oct. 15, 2015   (KR) .................. 10-2015-0144126
Dec. 11, 2015   (KR) .................. 10-2015-0177265

(51) Int. Cl.
*H01L 43/12*    (2006.01)
*H01L 21/3213*    (2006.01)
(Continued)

(52) U.S. Cl.
CPC ........ *H01L 43/12* (2013.01); *H01L 21/02071* (2013.01); *H01L 21/32138* (2013.01); *H01L 27/222* (2013.01)

(58) Field of Classification Search
CPC ... H01L 43/12; H01L 21/76892; H01L 43/08; H01L 43/02; H01L 21/3065;
(Continued)

(56) References Cited

U.S. PATENT DOCUMENTS 6,841,484 B2    1/2005   Ying et al.
7,365,017 B2    4/2008   Jo
(Continued)

FOREIGN PATENT DOCUMENTS

JP    3117187 B2    12/2000
KR    100342393 B1    7/2002
(Continued)

*Primary Examiner* — Jessica S Manno
*Assistant Examiner* — Mohammed R Alam
(74) *Attorney, Agent, or Firm* — Ward and Smith, P.A.

(57) ABSTRACT

Provided herein are methods of fabricating a magnetic memory device including forming magnetic tunnel junction patterns on a substrate, forming an interlayered insulating layer on the substrate to cover the magnetic tunnel junction patterns, forming a conductive layer on the interlayered insulating layer, patterning the conductive layer to form interconnection patterns electrically connected to the magnetic tunnel junction patterns, and performing a cleaning process on the interconnection patterns. The cleaning process is performed using a gas mixture of a first gas and a second gas. The first gas contains a hydrogen element (H), and the second gas contains a source gas different from that of the first gas.

15 Claims, 9 Drawing Sheets (51) Int. Cl.
*H01L 21/02* (2006.01)
*H01L 27/22* (2006.01)

(58) Field of Classification Search
CPC ......... H01L 21/32136; H01L 21/31138; H01L 21/31116; H01L 21/30655; H01L 21/32137; H01L 21/02057; H01J 37/32009; H01J 37/3244; H01J 37/32449; H01J 2237/334
See application file for complete search history.

(56) References Cited

U.S. PATENT DOCUMENTS

| | | | |
|---|---|---|---|
| 2004/0200498 A1* | 10/2004 | Wang | B08B 7/0035 134/1.1 |
| 2005/0020076 A1 | 1/2005 | Lee et al. | |
| 2006/0014373 A1* | 1/2006 | Jo | H01L 21/02071 438/618 |
| 2006/0019492 A1* | 1/2006 | Lee | H01L 21/02071 438/652 |
| 2006/0199370 A1 | 9/2006 | Dai et al. | |
| 2009/0184089 A1* | 7/2009 | Chebi | H01J 37/3244 216/13 |
| 2014/0269033 A1* | 9/2014 | Natori | H01L 43/08 365/158 |
| 2016/0308115 A1* | 10/2016 | Kanaya | H01L 27/228 |

FOREIGN PATENT DOCUMENTS

| | | |
|---|---|---|
| KR | 100347540 B1 | 8/2002 |
| KR | 20060079385 A | 7/2006 |
| KR | 20090055740 A | 6/2009 |

\* cited by examiner

METHODS OF FORMING AN INTERCONNECTION LINE AND METHODS OF FABRICATING A MAGNETIC MEMORY DEVICE USING THE SAME

CROSS-REFERENCE TO RELATED APPLICATIONS

The present application claims priority under 35 U.S.C. § 119 to Korean Patent Applications Nos. 10-2015-0144126 and 10-2015-0177265, filed on Oct. 15, 2015 and Dec. 11, 2015, respectively, in the Korean Intellectual Property Office. The entire content of each application is hereby incorporated by reference.

FIELD

The present disclosure relates to methods of forming a metal line and methods of fabricating a magnetic memory device using the same.

BACKGROUND

Due to an increasing demand for electronic devices with increased speed and/or reduced power consumption, semiconductor devices require faster operating speeds and/or lower operating voltages. Magnetic memory devices have been suggested to satisfy such requirements. For example, the magnetic memory device can provide technical advantages, such as reduced latency and/or non-volatility. As a result, magnetic memory devices are emerging as next-generation memory devices.

A magnetic memory device includes a magnetic tunnel junction (MTJ). A magnetic tunnel junction may include two magnetic layers and a tunnel barrier layer interposed therebetween. Resistance of the magnetic tunnel junction may vary depending on magnetization directions of the magnetic layers. For example, the resistance of the magnetic tunnel junction is higher when magnetization directions of the magnetic layers are anti-parallel to each other than when they are parallel to each other. Such a difference in resistance can be used for data storing operations of the magnetic memory device. However, more research is still needed to mass-produce a magnetic memory device and satisfy demands for a magnetic memory device with higher integration density and lower power consumption properties.

SUMMARY

Some embodiments of the inventive concept provide a method of forming an interconnection line to allow a semiconductor device to have improved electrical characteristics (e.g., reliability).

Some embodiments of the inventive concept provide a method of fabricating a magnetic memory device with improved electrical characteristics (e.g., reliability).

According to some embodiments of the inventive concept, a method of forming an interconnection line may include forming a conductive layer on an insulating layer on a substrate; patterning the conductive layer to form conductive patterns; and performing a cleaning process on the conductive patterns, wherein the cleaning process is performed using a gas mixture having a first gas and a second gas, wherein the first gas includes a hydrogen element (H), and the second gas includes a source gas that is reactive to the hydrogen element.

In some embodiments, a concentration of the hydrogen element (H) in the first gas is higher than that in the second gas.

In some embodiments, the first gas is a water vapor. In some embodiments, the first gas is a gas that is different from the second gas.

In some embodiments, the second gas is a source gas of at least one of oxygen ($O_2$) or nitrogen ($N_2$).

In some embodiments, the cleaning process is a plasma treatment process, wherein the gas mixture of the first and second gases is used as a plasma source.

In some embodiments, the conductive layer is formed of an aluminum-containing material.

In some embodiments, forming the conductive patterns includes performing an etching process using a chlorine-containing gas as a source gas, on the conductive layer.

In some embodiments, at least some of the hydrogen from the first gas reacts with the chlorine-containing gas to form hydrochloric acid (HCl).

In some embodiments, a remainder of the hydrogen from the first gas reacts with at least one of a source gas of the second gas.

According to some embodiments of the inventive concept, a method of forming an interconnection line may include forming a conductive layer on an insulating layer on a substrate; patterning the conductive layer to form conductive patterns; and performing a plasma treatment process on the conductive patterns, wherein the plasma treatment process is performed using a gas mixture having a first gas and a second gas as a plasma source, wherein the first gas includes a hydrogen element (H), and the second gas includes a source gas that is different from that of the first gas.

In some embodiments, the first gas is a water vapor.

In some embodiments, the second gas is a source gas of at least one of oxygen ($O_2$) or nitrogen ($N_2$).

According to some embodiments of the inventive concept, a method of forming an interconnection line may include forming an insulating layer on a substrate, forming a conductive layer on the insulating layer, patterning the conductive layer to form conductive patterns, and performing a cleaning process on the conductive patterns. The cleaning process may be performed using a gas mixture of a first gas and a second gas. Here, the first gas may contain a hydrogen element (H), and the second gas may contain a material different from that of the first gas.

In some embodiments, a concentration of the hydrogen element (H) in the first gas may be higher than that in the second gas.

In some embodiments, the second gas may contain at least one of oxygen (Oz) or nitrogen ($N_2$).

In some embodiments, the first gas may contain water vapor ($H_2O$).

In some embodiments, the cleaning process may be a plasma treatment process, in which the gas mixture of the first and second gases is used as a plasma source.

In some embodiments, the conductive layer may be formed of an aluminum-containing material.

In some embodiments, forming the conductive patterns may include performing a dry etching process, in which a chlorine-containing gas is used as a source gas, on the conductive layer.

According to some embodiments of the inventive concept, a method of fabricating a magnetic memory device may include forming magnetic tunnel junction patterns on a substrate, forming an interlayered insulating layer on the substrate to cover the magnetic tunnel junction patterns, forming a conductive layer on the interlayered insulating layer, patterning the conductive layer to form interconnection patterns electrically connected to the magnetic tunnel junction patterns, and performing a cleaning process on the interconnection patterns. The cleaning process may be performed using a gas mixture of a first gas and a second gas. Here, the first gas may contain a hydrogen element (H), and the second gas may contain a material different from that of the first gas.

In some embodiments, a concentration of the hydrogen element (H) in the first gas may be higher than that in the second gas.

In some embodiments, the second gas may contain at least one of oxygen ($O_2$) or nitrogen ($N_2$).

In some embodiments, the first gas may contain water vapor ($H_2O$).

In some embodiments, a volume ratio of the first gas in the gas mixture may range from 1% to 25%.

In some embodiments, the cleaning process may be a plasma treatment process, in which the gas mixture of the first and second gases is used as a plasma source.

In some embodiments, the method may further include forming bit lines in the interlayered insulating layer. The bit lines may be electrically connected to the magnetic tunnel junction patterns, and the interconnection patterns may be electrically connected to the magnetic tunnel junction patterns through the bit lines.

In some embodiments, when viewed in a vertical section, the interconnection patterns are at a higher level than that of the magnetic tunnel junction patterns from the substrate, and the bit lines may be positioned between the interconnection patterns and the magnetic tunnel junction patterns.

In some embodiments, the method may further include forming selection elements on the substrate, before forming the magnetic tunnel junction patterns. The magnetic tunnel junction patterns may be electrically connected to the selection elements, and the interlayered insulating layer may be formed to cover the selection elements.

In some embodiments, the conductive layer may be formed of an aluminum-containing material.

In some embodiments, forming the interconnection patterns may include performing a dry etching process, in which a chlorine-containing gas is used as a source gas, on the conductive layer.

In some embodiments, each of the magnetic tunnel junction patterns may include a free layer, a fixed layer, and a tunnel barrier therebetween, and each of the free and fixed layers may have a magnetization direction that is substantially parallel to an interface between the tunnel barrier and the free layer.

In some embodiments, each of the magnetic tunnel junction patterns may include a free layer, a fixed layer, and a tunnel barrier therebetween, and each of the free and fixed layers may have a magnetization direction that is substantially perpendicular to an interface between the tunnel barrier and the free layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

The inventive concepts will now be described more fully hereinafter with reference to the accompanying drawings, in which exemplary embodiments of the inventive concepts are shown. The inventive concepts and methods of achieving them will be apparent from the following exemplary embodiments that will be described in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like reference numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The methods described herein may comprise, consists essentially of or consists of the elements recited herein.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Unless defined otherwise, all technical and scientific terms used herein have the same meaning as commonly understood by one of ordinary skill in the art to which this inventive concept belongs. It is noted that the use of any and all examples, or terms provided herein is intended merely to better illuminate the inventive concept and is not a limitation on the scope of the inventive concept unless otherwise specified. Further, unless defined otherwise, all terms defined in generally used dictionaries may not be overly interpreted.

Figure 1:
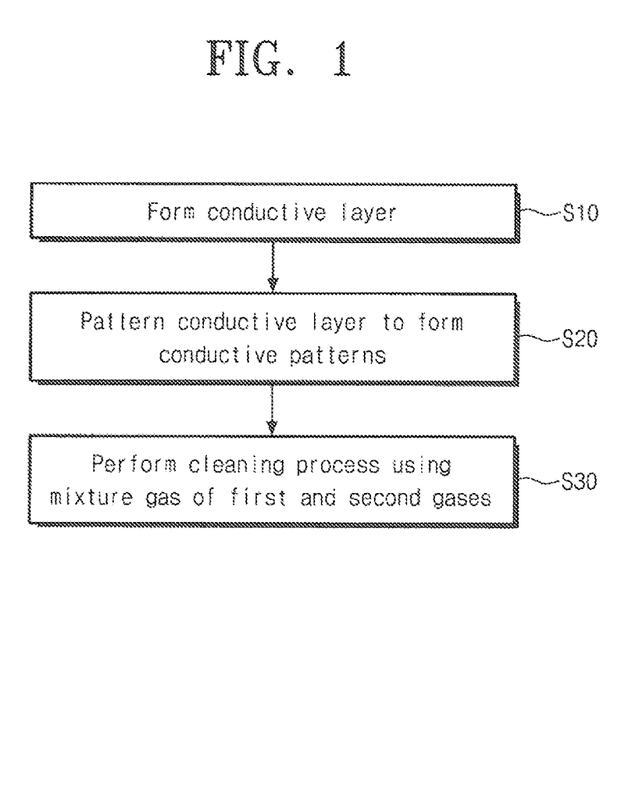
FIG. 1 is a flow chart illustrating a method of forming an interconnection line, according to some embodiments of the inventive concept.
Figure 2:
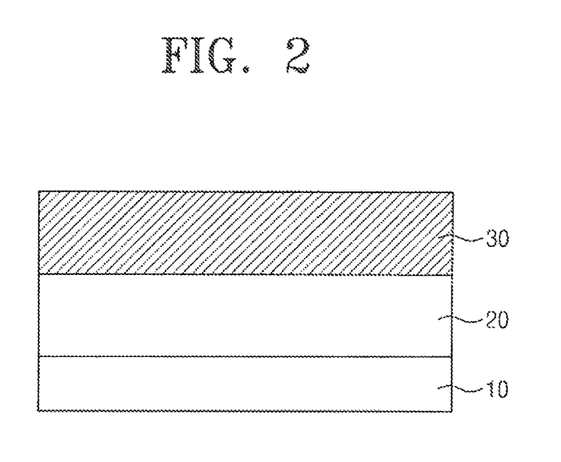
FIGS. 2 and 3 are sectional views illustrating a method of forming an interconnection line, according to some embodiments of the inventive concept.
Figure 3:
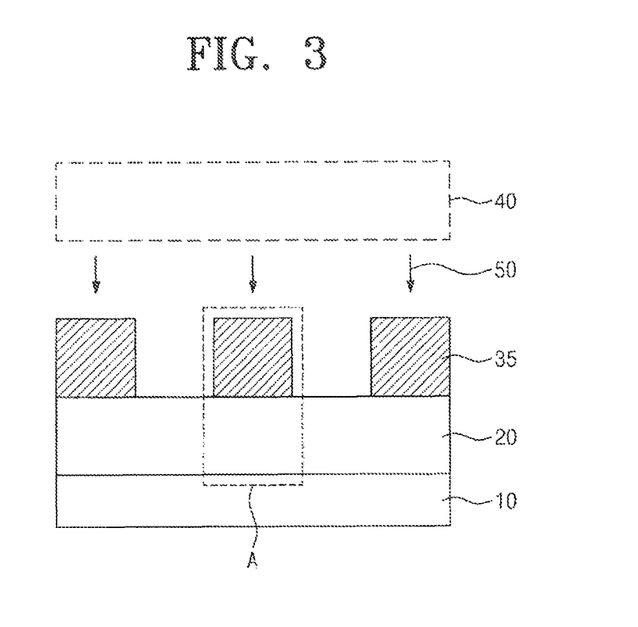
Figure 4:
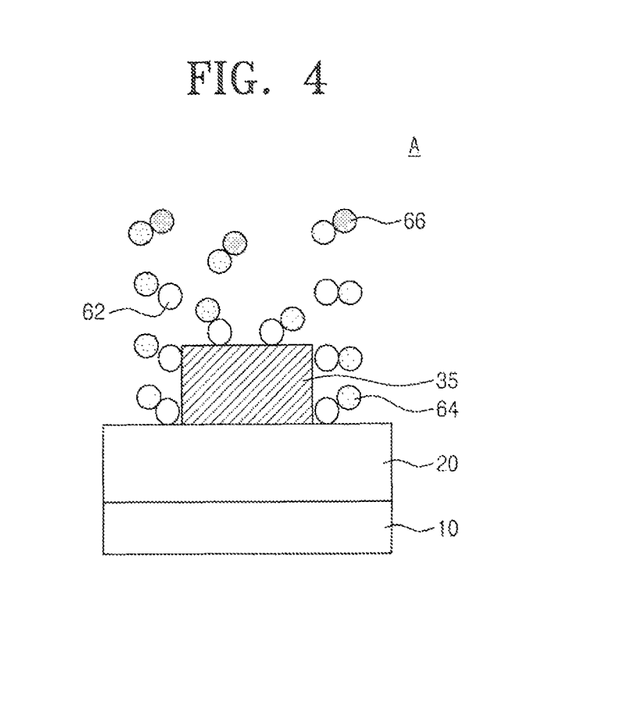
FIG. 4 is an enlarged view of a portion 'A' of FIG. 3.

FIG. 1 is a flow chart illustrating a method of forming an interconnection line, according to some embodiments of the inventive concept. FIGS. 2 and 3 are sectional views illustrating a method of forming an interconnection line, according to some embodiments of the inventive concept, and FIG. 4 is an enlarged view of a portion 'A' of FIG. 3.

Referring to FIGS. 1 and 2, an insulating layer 20 may be formed on a substrate 10. Selection elements (e.g., transistors or diodes) and memory elements may be provided on the substrate 10. The insulating layer 20 may be disposed on the substrate 10 to cover the selection element and the memory elements. The insulating layer 20 may be formed of or include at least one of an oxide layer (e.g., a silicon oxide layer), a nitride layer (e.g., a silicon nitride layer), or an oxynitride layer (e.g., a silicon oxynitride layer).

A conductive layer 30 may be formed on the insulating layer 20 (in S10). For example, the conductive layer 30 may be formed of or include aluminum.

Referring to FIGS. 1 and 3, the conductive layer 30 may be patterned to form conductive patterns 35 (in S20). The formation of the conductive patterns 35 may include forming mask patterns (not shown) on the conductive layer 30 to define positions and shapes of the conductive patterns 35 and etching the conductive layer 30 using the mask patterns as an etch mask. The etching of the conductive layer 30 may be performed, in a dry etching manner, using a chlorine (Cl) containing source gas.

After the formation of the conductive patterns 35, a cleaning process 50 may be performed using a gas mixture (or mixture gas) 40 of a first gas and a second gas (in S30). The first gas may be different from the second gas in terms of matter or material. For example, the first gas may contain a hydrogen element (H), and the second gas may contain an element (e.g., oxygen element (O) or nitrogen element (N)) that can be chemically reacted with the hydrogen element (H). A concentration of the hydrogen element (H) in the first gas may be higher than that in the second gas. For example, the first gas may include a vapor (e.g., $H_2O$), and the second gas may include at least one of oxygen ($O_2$) or nitrogen ($N_2$). The cleaning process 50 may be a plasma treatment process, in which the gas mixture 40 of the first and second gases is used as a plasma source.

In detail, referring to FIG. 4, chlorine sources 62 may remain on the conductive patterns 35, after formation of the conductive patterns 35. During the cleaning process 50, some of the hydrogen source 64 supplied from the first gas may be used to remove the chlorine source 62. For example, the chlorine source 62 may be reacted with the hydrogen source 64 to form hydrochloric acid (HCl), and volatilization of the hydrochloric acid (HCl) may lead to the removal of the chlorine source 62 from the conductive patterns 35. During the cleaning process 50, source 66 (e.g., oxygen source and/or nitrogen source) supplied from the second gas may be reacted with the remainder of the hydrogen source 64. For example, the remainder of the hydrogen source 64 may be reacted with the oxygen source 66 supplied from the second gas to form a hydroxyl group (OH) material.

In the case where the chlorine source 62 remains on the conductive patterns 35, the chlorine sources 62 may lead to several technical issues (e.g., corrosion of the conductive patterns 35). Accordingly, a cleaning process using a hydrogen-containing source gas (e.g., $H_2O$) may be performed to remove the chlorine source 62 from the conductive patterns 35. During the cleaning process, some of the hydrogen source supplied from the source gas may be injected or diffused into the insulating layer 20 and may cause deterioration of the memory elements provided on the substrate 10.

However, according to some embodiments of the inventive concept, the cleaning process 50 may be performed using the gas mixture 40 of the first and second gases as a source gas, and here, the first and second gases may be different from each other in terms of matter or material. For example, the first gas may include a hydrogen element (11), and the second gas may include an element that can be chemically reacted with hydrogen element (H). In this case, some of the hydrogen source 64 supplied from the first gas may be used to remove the chlorine source 62, and the remainder of the hydrogen source 64 may be reacted with the source 66 supplied from the second gas. Accordingly, it is possible to suppress the remainder of the hydrogen source 64 from being injected or diffused into the insulating layer 20 and consequently to prevent the memory elements provided on the substrate 10 from being deteriorated. As a result, it is possible to improve electric characteristics and reliability of the semiconductor device including the conductive patterns 35.

Figure 5:
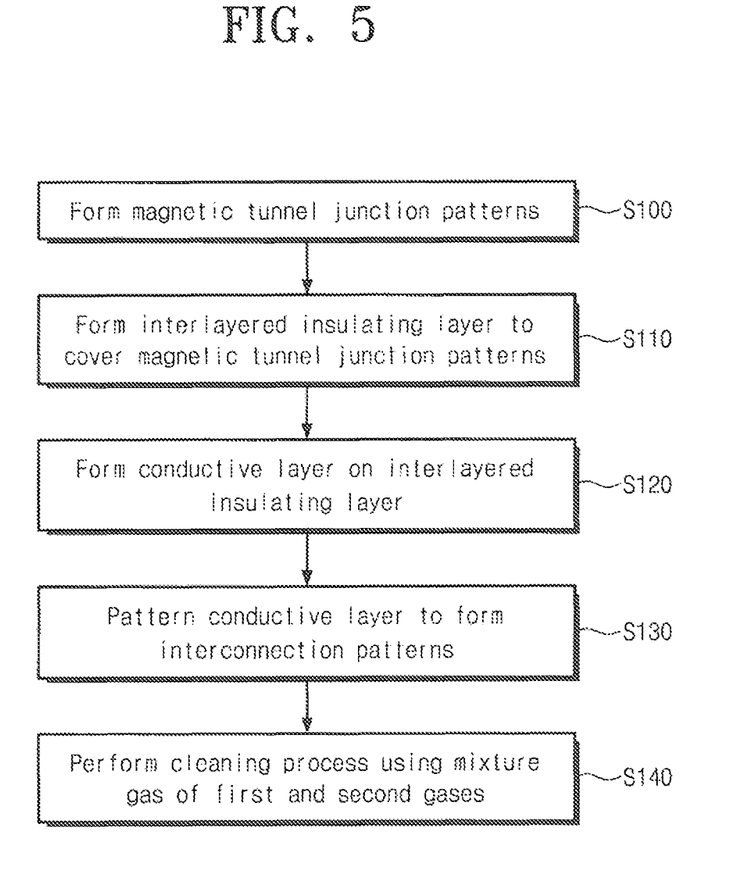
FIG. 5 is a flow chart illustrating a method of fabricating a magnetic memory device, according to some embodiments of the inventive concept.
Figure 10:
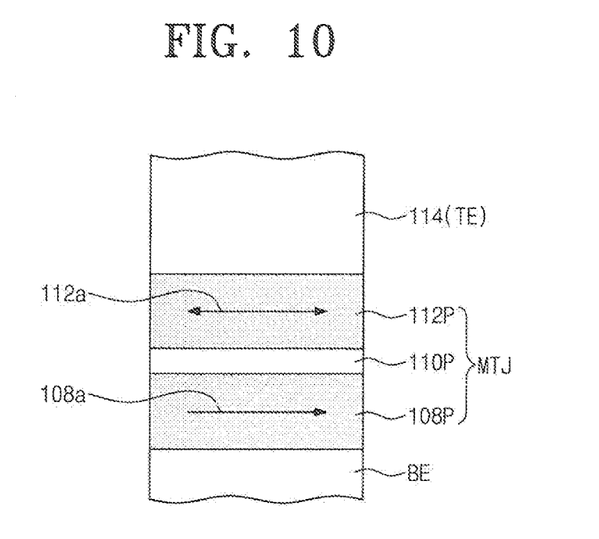
FIG. 10 is a sectional view illustrating an example of a magnetic tunnel junction pattern according to some embodiments of the inventive concept.
Figure 11:
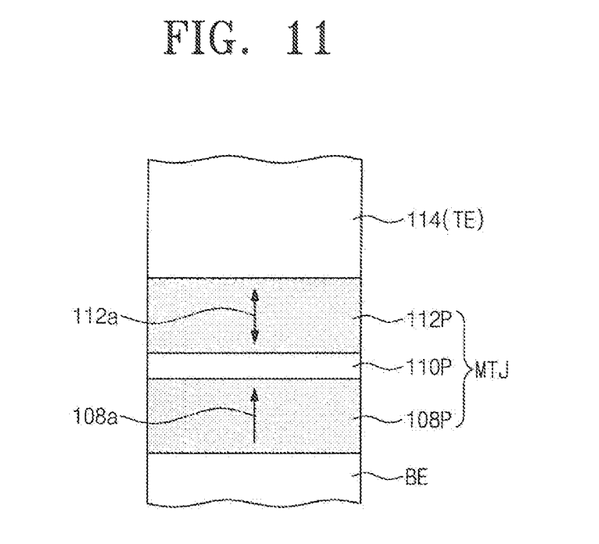
FIG. 11 is a sectional view illustrating another example of a magnetic tunnel junction pattern according to some embodiments of the inventive concept.

FIG. 5 is a flow chart illustrating a method of fabricating a magnetic memory device according to some embodiments of the inventive concept. FIGS. 6 through 9 are sectional views illustrating a method of fabricating a magnetic memory device according to some embodiments of the inventive concept. FIG. 10 is a sectional view illustrating an example of a magnetic tunnel junction pattern according to some embodiments of the inventive concept, and FIG. 11 is a sectional view illustrating another example of a magnetic tunnel junction pattern according to some embodiments of the inventive concept.

Figure 6:
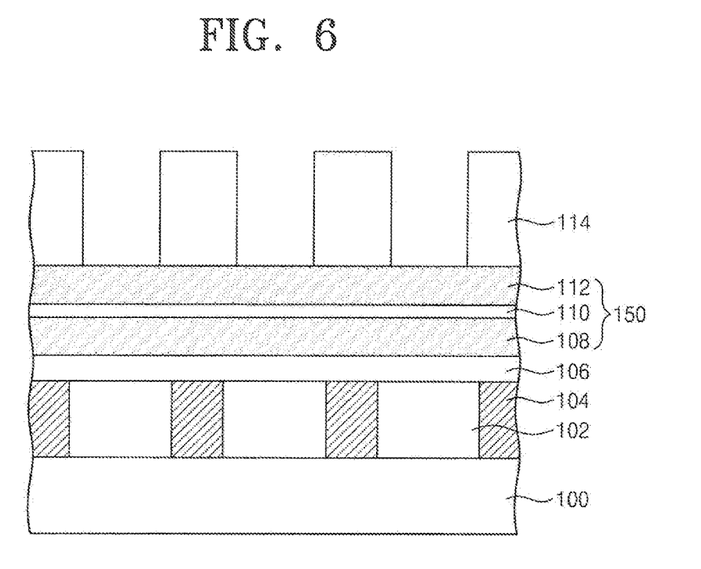
FIGS. 6 to 9 are sectional views illustrating a method of fabricating a magnetic memory device, according to some embodiments of the inventive concept.

Referring to FIG. 6, a first interlayered insulating layer 102 may be formed on a substrate 100. The substrate 100 may be or include a semiconductor substrate. For example, the substrate 100 may include a silicon wafer, a germanium wafer, or a silicon-germanium wafer. In some embodiments, selection elements (not shown) may be formed on the substrate 100, and the first interlayered insulating layer 102 may be formed to cover the selection elements. The selection elements may be field effect transistors. Alternatively, the selection elements may be diodes. The first interlayered insulating layer 102 may be a single- or multi-layered structure including at least one of an oxide layer, a nitride layer, or an oxynitride layer.

Lower contact plugs 104 may be formed in the first interlayered insulating layer 102. Each of the lower contact plugs 104 may be formed to penetrate the first interlayered insulating layer 102 and may be electrically coupled to a terminal of a corresponding one of the selection elements. The lower contact plugs 104 may include at least one of doped semiconductor materials (e.g., doped silicon), metals (e.g., tungsten, titanium, and/or tantalum), conductive metal nitrides (e.g., titanium nitride, tantalum nitride, and/or tungsten nitride), or metal-semiconductor compounds (e.g., metal silicide).

A lower electrode layer 106 may be formed on the first interlayered insulating layer 102, and a magnetic tunnel junction layer 150 may be formed on the lower electrode layer 106. The lower electrode layer 106 may be interposed between the first interlayered insulating layer 102 and the magnetic tunnel junction layer 150.

The lower electrode layer 106 may be formed of or include at least one of a conductive metal nitride (e.g., titanium nitride or tantalum nitride). The lower electrode layer 106 may include a material (e.g., ruthenium (Ru)), allowing magnetic layers constituting the magnetic tunnel junction layer 150 to be grown therefrom. The lower electrode layer 106 may be formed using a sputtering process, a chemical vapor deposition process, or an atomic layer deposition process.

The magnetic tunnel junction layer 150 may include a first magnetic layer 108, a tunnel barrier layer 110, and a second magnetic layer 112, which are sequentially stacked on the lower electrode layer 106. One of the first and second magnetic layers 108 and 112 may have a fixed magnetization direction and thereby serve as a fixed layer, and the other may serve as a free layer, whose magnetization direction can be switched to be parallel or anti-parallel to that of the fixed layer.

As an example, the magnetization directions of the fixed and free layers may be substantially perpendicular to an interface between the tunnel barrier layer 110 and the second magnetic layer 112. For example, each of the fixed and free layers may include at least one of perpendicular magnetic materials (e.g., CoFeTb, CoFeGd, and CoFeDy), $L1_0$ perpendicular magnetic materials, hexagonal-close-packed (HCP) CoPt-based materials, or perpendicular magnetic structures. Here, the $L1_0$ perpendicular magnetic materials may include at least one of $L1_0$ FePt, $L1_0$ FePd, $L1_0$ CoPd, or $L1_0$ CoPt. The perpendicular magnetic structure may include magnetic layers and non-magnetic layers that are alternatingly and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where n is the number of stacked pairs of the layers (n is an integer greater than 1).

As another example, the magnetization directions of the fixed and free layers may be substantially parallel to the interface between the tunnel barrier layer 110 and the second magnetic layer 112. In this case, each of the fixed and free layers may include a ferromagnetic material. The fixed layer may further include an anti-ferromagnetic material for fixing a magnetization direction of the ferromagnetic material of the fixed layer.

The tunnel barrier layer 110 may be formed of or include at least one of magnesium oxide, titanium oxide, aluminum oxide, magnesium-zinc oxide, or magnesium-boron oxide.

Each of the first magnetic layer 108, the tunnel barrier layer 110, and the second magnetic layer 112 may be formed by a physical vapor deposition process or a chemical vapor deposition process.

Conductive mask patterns 114 may be formed on the magnetic tunnel junction layer 150. The conductive mask patterns 114 may be formed of or include at least one of tungsten, titanium, tantalum, aluminum, or metal nitrides (e.g., titanium nitride and tantalum nitride). The conductive mask patterns 114 may be used to define positions and shapes of magnetic tunnel junction patterns in a subsequent process.

Figure 7:
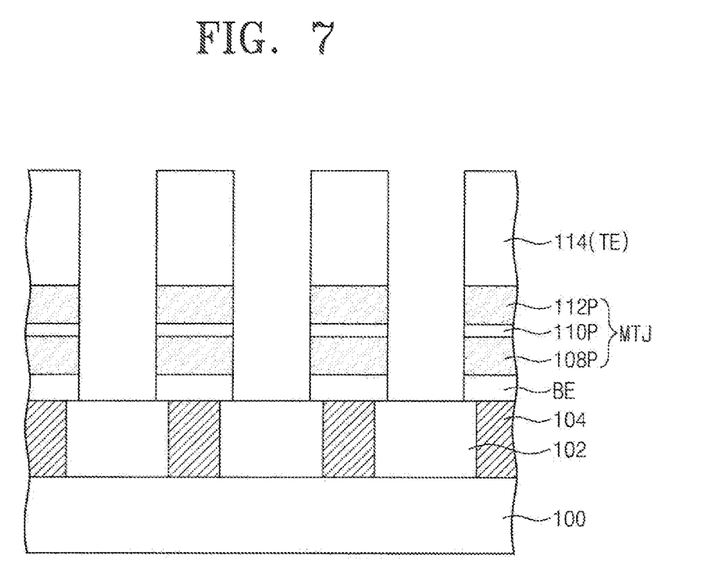

Referring to FIGS. 5 and 7, the magnetic tunnel junction layer 150 may be etched using the conductive mask patterns 114 as an etch mask to form magnetic tunnel junction patterns MTJ (in S100). The etching process may be performed using, for example, a sputtering method. The magnetic tunnel junction patterns MTJ may be formed to be spaced apart from each other in a direction parallel to a top surface of the substrate 100 (i.e. in a horizontal direction).

In addition, the lower electrode layer 106 may be etched by the etching process, thereby forming lower electrodes BE that are spaced apart from each other in the horizontal direction. The lower electrodes BE may be electrically connected to the lower contact plugs 104, which are formed in the first interlayered insulating layer 102, respectively. In some embodiments, a bottom surface of each of the lower electrodes BE may be in contact with a top surface of each of the lower contact plugs 104.

The magnetic tunnel junction patterns MTJ may be provided on the lower electrodes BE, respectively. Each of the magnetic tunnel junction patterns MTJ may be electrically connected to a corresponding one of the lower contact plugs 104 via a corresponding one of the lower electrodes BE. Each of the magnetic tunnel junction patterns MTJ may include a first magnetic pattern 108P, a tunnel barrier 110P, and a second magnetic pattern 112P, which are sequentially stacked on each of the lower electrodes BE.

The conductive mask patterns 114 may serve as upper electrodes TE that are provided on the magnetic tunnel junction patterns MTJ.

In some embodiments, as shown in FIG. 10, magnetization directions 108a and 112a of the first and second magnetic patterns 108P and 112P may be substantially parallel to the interface between the tunnel barrier 110P and the second magnetic pattern 112P. Although FIG. 10 illustrates the first and second magnetic patterns 108P and 112P serving as the fixed and free layers, respectively, the inventive concept is not limited thereto. For example, unlike that shown in FIG. 10, in some embodiments, the first magnetic pattern 108P may be used as the free layer, and the second magnetic pattern 112P may be used as the fixed layer.

In the case where the magnetization directions 108a and 112a are substantially parallel to the interface, at least one of the first and second magnetic patterns 108P and 12P may include a ferromagnetic material. The first magnetic pattern 108P may further include an anti-ferromagnetic material for fixing a magnetization direction of the ferromagnetic material in the first magnetic pattern 108P.

In certain embodiments, as shown in FIG. 11, the magnetization directions 108a and 112a of the first and second magnetic patterns 108P and 112P may be substantially perpendicular to the interface between the tunnel barrier 110P and the second magnetic pattern 112P. Although FIG. 11 illustrates the first and second magnetic patterns 108P and 112P serving as the fixed and free layers, in some embodiments, the first and second magnetic patterns 108P and 112P may be used as the free and fixed layers, respectively, unlike that shown in FIG. 11.

In the case where the magnetization directions 108a and 112a are substantially perpendicular to the interface, the first and second magnetic patterns 108P and 112P may include at least one of perpendicular magnetic materials (e.g., CoFeTb, CoFeGd, and CoFeDy), $L1_0$ perpendicular magnetic materials, HCP CoPt-based materials, or perpendicular magnetic structures. Here, the $L1_0$ perpendicular magnetic materials may include at least one of $L1_0$ FePt, $L1_0$ FePd, $L1_0$ CoPd, or $L1_0$ CoPt. The perpendicular magnetic structure may include magnetic layers and non-magnetic layers that are alternatingly and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where n is the number of stacked pairs of the layers (n is an integer greater than 1).

Figure 8:
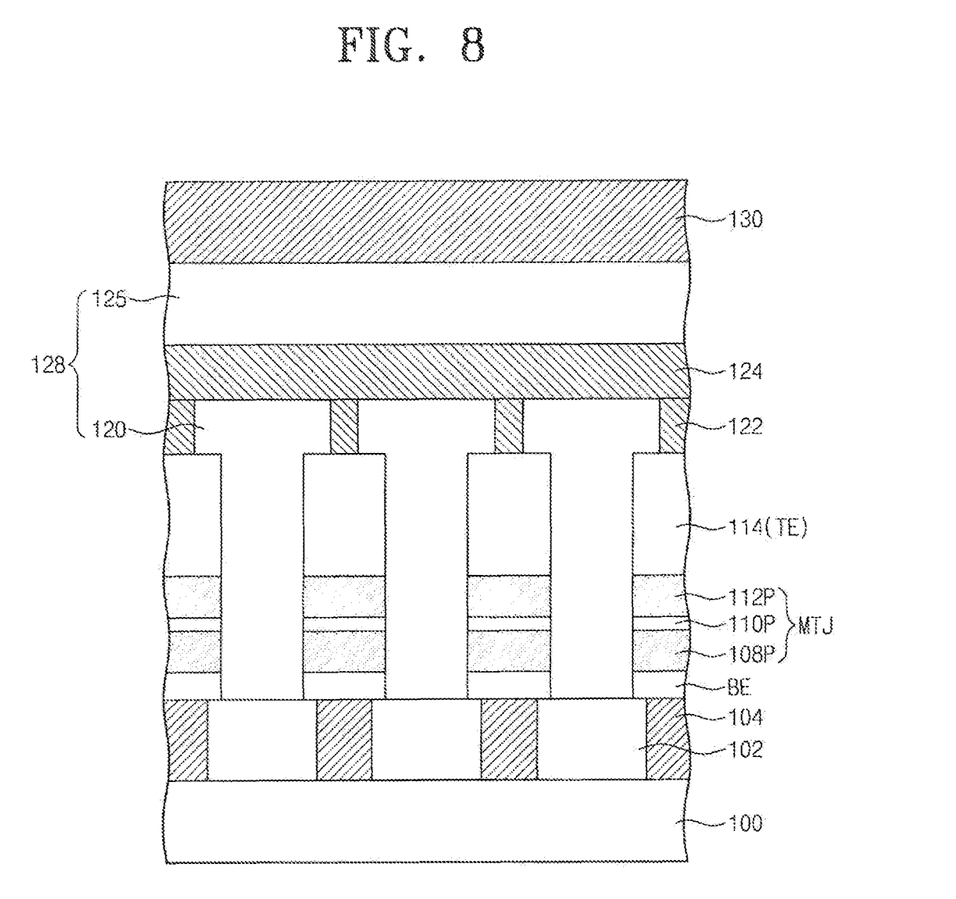

Referring to FIGS. 5 and 8, an interlayered insulating layer 128 may be formed on the first interlayered insulating layer 102 to cover the magnetic tunnel junction patterns MTJ (in S110).

For example, a second interlayered insulating layer 120 may be formed on the first interlayered insulating layer 102 to cover the lower electrodes BE, the magnetic tunnel junction patterns MTJ, and the upper electrodes TE. The second interlayered insulating layer 120 may be formed to have a single- or multi-layered structure. As an example, the second interlayered insulating layer 120 may be formed of or include at least one of an oxide layer (e.g., a silicon oxide layer), a nitride layer (e.g., a silicon nitride layer), or an oxynitride layer (e.g., a silicon oxynitride layer).

Upper contact plugs 122 may be formed in the second interlayered insulating layer 120 and may be connected to the upper electrodes TE, respectively. In some embodiments, the formation of the upper contact plugs 122 may include forming contact holes in the second interlayered insulating layer 120 to expose upper portions of the upper electrodes TE and forming the upper contact plugs 122 in the contact holes, respectively. The upper contact plugs 122 may be formed of or include at least one of doped semiconductor materials (e.g., doped silicon), metals (e.g., tungsten, titanium, and/or tantalum), conductive metal nitrides (e.g., titanium nitride, tantalum nitride, and/or tungsten nitride), or metal-semiconductor compounds (e.g., metal silicide).

Bit lines 124 may be formed on the second interlayered insulating layer 120. As an example, the formation of the bit lines 124 may include forming a mold layer (not shown) on the second interlayered insulating layer 120, patterning the mold layer to form trenches (not shown) connected to the contact holes, and forming the bit lines 124 in the trenches, respectively. In some embodiments, the upper contact plugs 122 and the bit lines 124 may be formed using the same process. For example, the formation of the upper contact plugs 122 and the bit lines 124 may include forming a conductive layer (not shown) on the mold layer to fill the contact holes and the trenches and planarizing the conductive layer to expose the mold layer. The bit lines 124 may be formed of or include at least one of doped semiconductor materials (e.g., doped silicon), metals (e.g., tungsten, titanium, and/or tantalum), conductive metal nitrides (e.g., titanium nitride, tantalum nitride, and/or tungsten nitride), or metal-semiconductor compounds (e.g., metal silicide).

A third interlayered insulating layer 125 may be formed on the second interlayered insulating layer 120 to cover the bit lines 124. The third interlayered insulating layer 125 may be formed to have a single- or multi-layered structure. As an example, the third interlayered insulating layer 125 may be formed of or include at least one of an oxide layer (e.g., a silicon oxide layer), a nitride layer (e.g., a silicon nitride layer), or an oxynitride layer (e.g., a silicon oxynitride layer).

The second and third interlayered insulating layers 120 and 125 may be defined as the interlayered insulating layer 128 covering the magnetic tunnel junction patterns MTJ. The upper contact plugs 122 and the bit lines 124 may be formed in the interlayered insulating layer 128 and may be electrically connected to the magnetic tunnel junction patterns MTJ.

A conductive layer 130 may be formed on the interlayered insulating layer 128 (in S120). As an example, the conductive layer 130 may be formed of or include aluminum. The conductive layer 130 may be formed by, for example, a sputtering process.

Figure 9:
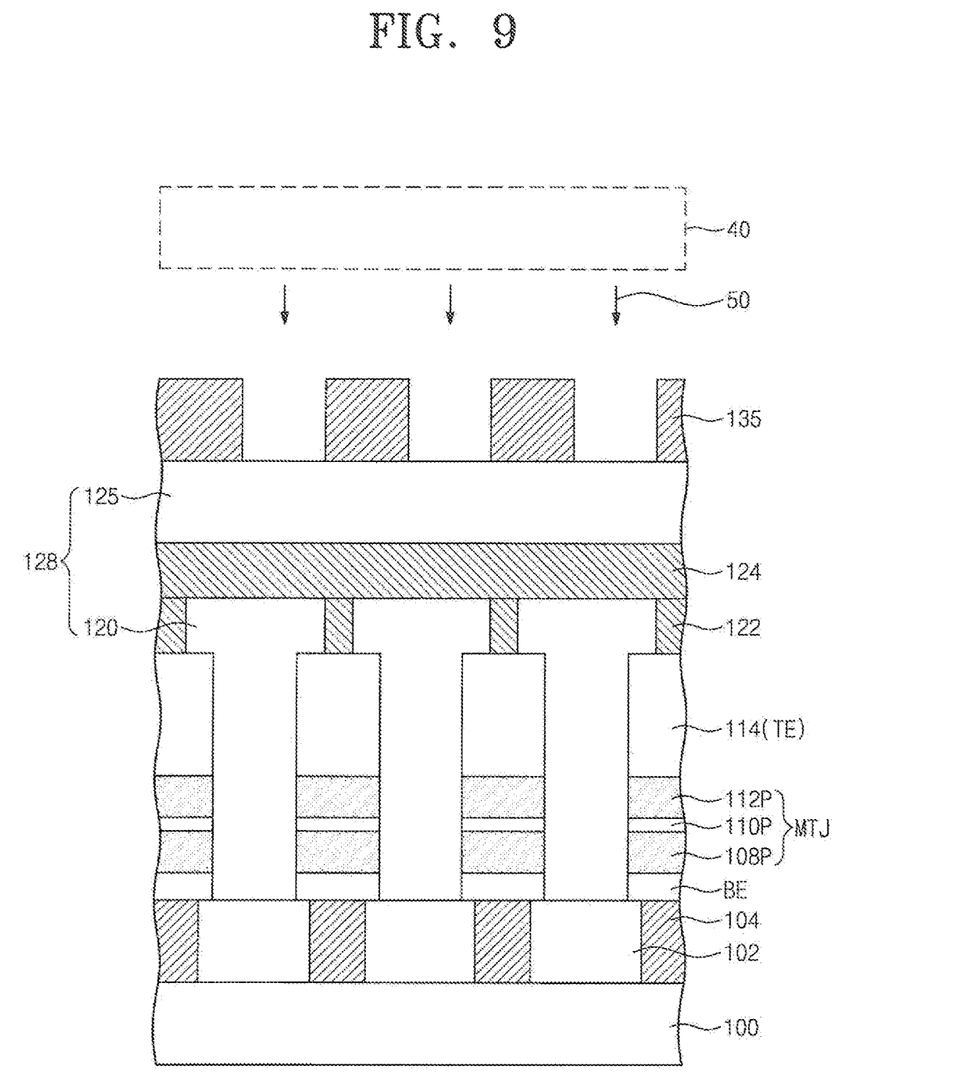

Referring to FIGS. 5 and 9, the conductive layer 130 may be patterned to form interconnection patterns 135 (in S130). The formation of the interconnection patterns 135 may include forming mask patterns (not shown) on the conductive layer 130 to define positions and shapes of the interconnection patterns 135 and etching the conductive layer 130 using the mask patterns as an etch mask. The etching of the conductive layer 130 may be performed, in a dry etching manner, using a chlorine (Cl) containing source gas. After the etching process, a chlorine source 62 may remain on the interconnection patterns 135, as described with reference to FIG. 4.

After the formation of the interconnection patterns 135, a cleaning process 50 may be performed using a gas mixture 40 of first and second gases (in S140). The first gas may be different from the second gas in terms of matter or material. The first gas may include a hydrogen element (H), and the second gas may include an element (e.g., oxygen element (0) or nitrogen element (N)) that can be chemically reacted with a hydrogen element (H). A concentration of the hydrogen element (H) in the first gas may be higher than that in the second gas. For example, the first gas may include a vapor (e.g., $H_2O$), and the second gas may include at least one of oxygen ($O_2$) or nitrogen ($N_2$). The cleaning process 50 may be a plasma treatment process, in which the gas mixture 40 of the first and second gases is used as a plasma source.

During the cleaning process 50, some of hydrogen source 64 supplied from the first gas may be used to remove the chlorine source 62, as described previously with reference to FIG. 4. For example, the chlorine source 62 may be reacted with the hydrogen source 64 to form hydrochloric acid (HCl), and volatilization of the hydrochloric acid (HCl) may lead to the removal of the chlorine source 62 from the interconnection patterns 135. During the cleaning process 50, source 66 (e.g., oxygen source and/or nitrogen source) supplied from the second gas may be reacted with the remainder of the hydrogen source 64. For example, the remainder of the hydrogen source 64 may be reacted with the oxygen source 66 supplied from the second gas to form a hydroxyl group (OH) material.

In the case where the chlorine source 62 remains on the interconnection patterns 135, the chlorine source 62 may lead to several technical issues (e.g., corrosion of the interconnection patterns 135). In this case, a cleaning process using a hydrogen-containing source gas (e.g., $H_2O$) may be performed to remove the chlorine source 62 from the interconnection patterns 135. During the cleaning process, some of the hydrogen source supplied from the source gas may be injected or diffused into magnetic patterns of the magnetic tunnel junction patterns MTJ through the interlayered insulating layer 128, and this may lead to deterioration in magnetic characteristics of the magnetic tunnel junction patterns MTJ.

However, according to some embodiments of the inventive concept, the cleaning process 50 may be performed using the gas mixture 40 of the first and second gases as a source gas, and here, the first and second gases may be different from each other in terms of matter or material. For example, the first gas may include a hydrogen element (H), and the second gas may include an element that can be chemically reacted with a hydrogen element (H). In this case, some of the hydrogen source 64 supplied from the first gas may be used to remove the chlorine source 62, and the remainder of the hydrogen source 64 may be reacted with the source 66 supplied from the second gas. Accordingly, it is possible to suppress the remainder of the hydrogen source 64 from being injected or diffused into the magnetic tunnel junction patterns MTJ and consequently to suppress or prevent the magnetic tunnel junction patterns MTJ from being deteriorated.

In some embodiments, the first gas in the gas mixture 40 may have a volume ratio ranging from about 1% to about 25%. In the case where the volume ratio of the first gas in the gas mixture 40 is less than about 1%, there may be difficulty in removing the chlorine source 62 from the interconnection patterns 135. In contrast, in the case where the volume ratio of the first gas in the gas mixture 40 is greater than about 25%, there may be difficulty in suppressing the hydrogen source 64 supplied from the first gas from being injected or diffused into the magnetic tunnel junction patterns MTJ.

The interconnection patterns 135 may be electrically connected to the bit lines 124. The interconnection patterns 135 may be electrically connected to the bit lines 124 through at least one conductive pattern (not shown), which may be formed in the third interlayered insulating layer 125. The interconnection patterns 135 may be electrically connected to the magnetic tunnel junction patterns MTJ through the bit lines 124 and the upper contact plugs 122.

When measured from the top surface of the substrate 100, the interconnection patterns 135 may be positioned at a higher level than that of the magnetic tunnel junction patterns MTJ. The bit lines 124 may be positioned between the interconnection patterns 135 and the magnetic tunnel junction patterns MTJ. In some embodiments, the interconnection patterns 135 may be top interconnection lines, which are provided at the uppermost level of the magnetic memory device.

Figure 12:
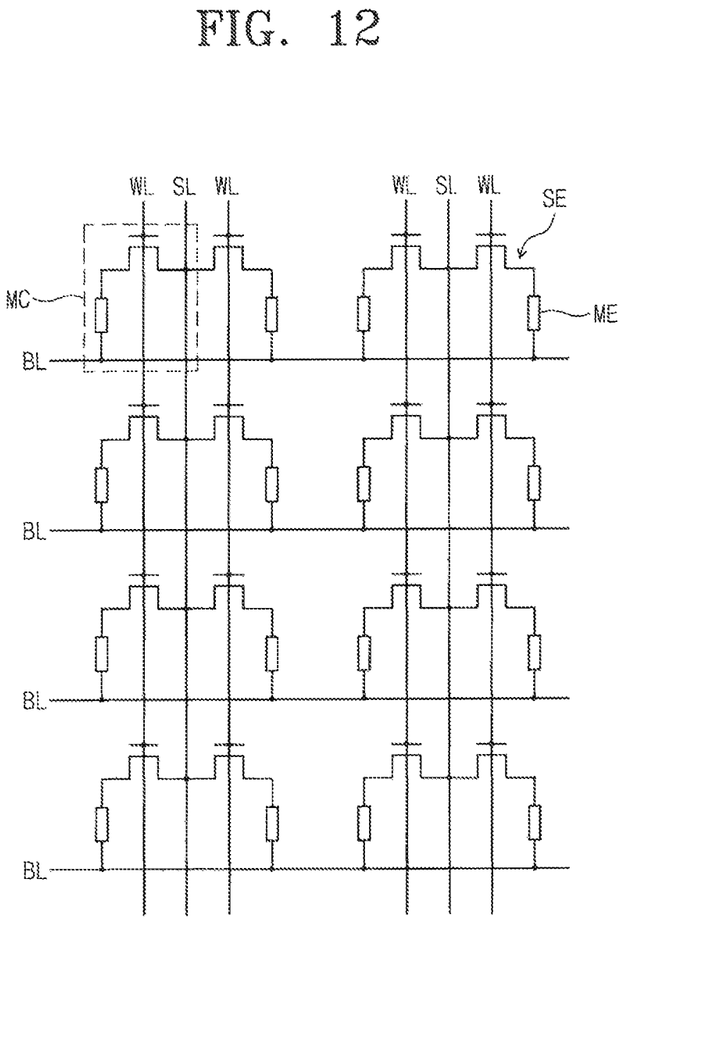
FIG. 12 is a circuit diagram illustrating a portion of a cell array of a magnetic memory device, according to some embodiments of the inventive concept.

FIG. 12 is a circuit diagram illustrating a portion of a cell array of a magnetic memory device, according to some embodiments of the inventive concept.

Referring to FIG. 12, a plurality of unit memory cells MC may be arranged two-dimensionally or three-dimensionally. Each of the unit memory cells MC may be provided between a word line WL and a bit line BL crossing each other. Each of the unit memory cells MC may include a memory element ME and a selection element SE. The selection element SE and the memory element ME may be electrically connected in series.

The memory element ME may be provided between and connected to the bit line BL and the selection element SE. The selection element SE may be provided between and connected to the memory element ME and a source line SL and may be controlled by the word line WL. The memory element ME may be a variable resistance device whose resistance can be switched to one of at least two states by an electric pulse applied thereto. For example, the memory element ME may be formed to have a layered structure, whose electric resistance can be changed by a spin transfer process of an electric current passing therethrough. In some embodiments, the memory element ME may have a layered structure configured to exhibit a magneto-resistance property and may include at least one ferromagnetic material and/or at least one antiferromagnetic material.

The selection element SE may be configured to control a flow of an electric current to be supplied to the memory element ME, in response to a voltage applied to the word line WL. For example, the selection element SE may be one of a diode, a pnp bipolar transistor, an npn bipolar transistor, an NMOS field effect transistor (FET), and a PMOS FET. In the case that the selection element SE is a three-terminal switching device, such as bipolar transistors and MOSFETs, the memory array may further, include the source line SL connected to the transistors (e.g., source electrodes). Each of the source lines SL may be provided between adjacent ones of the word lines WL, and each of the source lines SL may be shared by at least two transistors.

Figure 13:
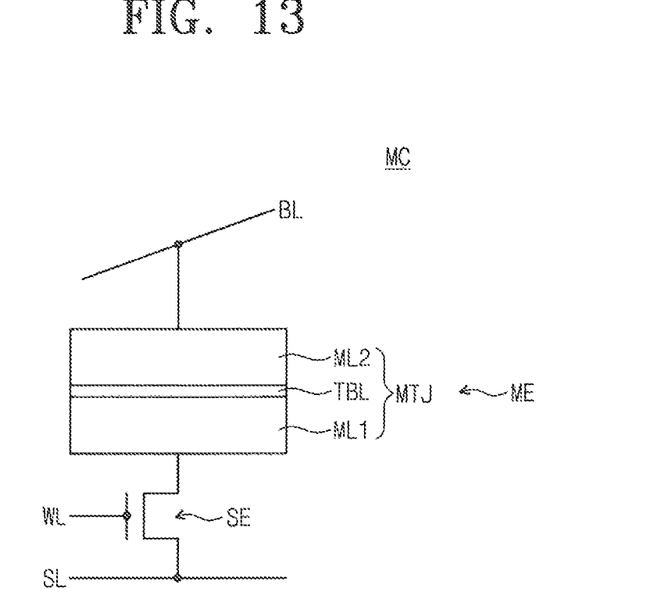
FIG. 13 is a schematic diagram illustrating a unit memory cell of a magnetic memory device according to some embodiments of the inventive concept.

FIG. 13 is a schematic diagram illustrating a unit memory cell of a magnetic memory device according to some embodiments of the inventive concept.

Referring to FIG. 13, each of the unit memory cells MC may include a magnetic memory element ME and a selection element SE. The selection element SE and the magnetic memory element ME may be electrically connected in series to each other. The magnetic memory element ME may be provided between and connected to the bit line BL and the selection element SE. The selection element SE may be provided between the magnetic memory element ME and the source line SL and may be controlled by a voltage applied to the word line WL.

The magnetic memory element ME may be or include a magnetic tunnel junction MTJ including magnetic layers ML and ML2, which are spaced apart from each other, and a tunnel barrier layer TBL between the magnetic layers ML1 and ML2. One of the magnetic layers ML1 and ML2 may have a fixed magnetization direction, regardless of the presence of an external magnetic field generated under a typical user condition, and thus, it may serve as a fixed layer of the magnetic tunnel junction MTJ. The other of the magnetic layers ML1 and ML2 may have a magnetization direction, which can be switched by an external magnetic field applied thereto, and thus, it may serve as a free layer of the magnetic tunnel junction MTJ.

The electrical resistance of the magnetic tunnel junction MTJ may be much higher when magnetization directions of the fixed and free layers are anti-parallel than when they are parallel. This means that the electrical resistance of the magnetic tunnel junction MTJ can be controlled by changing the magnetization direction of the free layer. A difference in magnetization direction between the fixed and free layers may lead to a difference in electrical resistance of the magnetic tunnel junction MTJ, and this difference may be used as a data storing mechanism of the unit memory cell MC.

According to some embodiments of the inventive concept, a dry etching process using a chlorine-containing source gas may be performed to form interconnection patterns from a conductive layer, and then, a cleaning process may be performed using a gas mixture of a first gas and a second gas. Here, the first gas may contain a hydrogen element (H), and the second gas may contain an element that can be chemically reacted with the hydrogen element (H). In this case, some of the hydrogen source in the first gas may be used to remove a chlorine source remaining on the interconnection patterns, and thus, it is possible to prevent or suppress the remaining chlorine source from causing failures (e.g., corrosion) of the interconnection patterns. In addition, the remainder of the hydrogen source may be reacted with sources (e.g., oxygen source or nitrogen source) supplied from the second gas, and thus, during the cleaning process, it is possible to suppress the remainder of the hydrogen source from being injected or diffused into the magnetic tunnel junction patterns and consequently to prevent magnetic characteristics of the magnetic tunnel junction patterns from being deteriorated.

As a result, the magnetic memory device can be fabricated to have improved electrical characteristics (e.g., reliability).

According to some embodiments of the inventive concept, a method of forming an interconnection line is provided to allow a semiconductor device to have improved electrical characteristics (e.g., reliability).

In the case where a magnetic memory device is fabricated using the method of forming an interconnection line, it is possible to suppress or prevent magnetic characteristics of magnetic tunnel junction patterns from being deteriorated and consequently to improve electrical characteristics (e.g., reliability) of the magnetic memory device.

While example embodiments of the inventive concepts have been particularly shown and described, it will be understood by one of ordinary skill in the art that variations in form and detail may be made therein without departing from the spirit and scope of the attached claims.

What is claimed is:

1. A method of forming an interconnection line, comprising: forming a conductive layer on an insulating layer on a substrate; patterning the conductive layer to form conductive patterns, wherein forming the conductive patterns comprises performing an etching process using a chlorine-containing gas as a source gas, on the conductive layer; and performing a cleaning process on the conductive patterns, wherein the cleaning process is performed to remove chlorine sources remaining on the conductive patterns, wherein the cleaning process is performed using a gas mixture having a first gas and a second gas, wherein the first gas is a water vapor, and the second gas includes a source gas that is reactive to a hydrogen element, wherein the source gas of the second gas includes at least one of oxygen ($O_2$) or nitrogen ($N_2$), wherein at least some of the hydrogen from the first gas reacts with the chlorine sources remaining on the conductive patterns, and wherein a remainder of the hydrogen from the first gas reacts with the source gas of the second gas.

2. The method of claim 1, wherein a concentration of the hydrogen element (H) in the first gas is higher than that in the second gas.

3. The method of claim 1, wherein the cleaning process is a plasma treatment process, wherein the gas mixture of the first and second gases is used as a plasma source.

4. The method of claim 1, wherein the conductive layer is formed of an aluminum-containing material.

5. A method of forming an interconnection line, comprising: forming a conductive layer on an insulating layer on a substrate; patterning the conductive layer to form conductive patterns, wherein forming the conductive patterns comprises performing an etching process using a chlorine-containing gas as a source gas, on the conductive layer; and performing a plasma treatment process on the conductive patterns, wherein the plasma treatment process is performed to remove chlorine sources remaining on the conductive patterns, wherein the plasma treatment process is performed using a gas mixture having a first gas and a second gas as a plasma source, wherein the first gas is a water vapor, and the second gas includes a source gas that is different from that of the first gas and is reactive to a hydrogen element, wherein the source gas of the second gas includes at least one of oxygen ($O_2$) or nitrogen ($N_2$), wherein at least some of the hydrogen from the first gas reacts with the chlorine sources remaining on the conductive patterns, and wherein a remainder of the hydrogen from the first gas reacts with the source gas of the second gas.

6. A method of fabricating a magnetic memory device, comprising: forming magnetic tunnel junction patterns on a substrate; forming an interlayer insulating layer on the substrate to cover the magnetic tunnel junction patterns; forming a conductive layer on the interlayer insulating layer; patterning the conductive layer to form interconnection patterns electrically connected to the magnetic tunnel junction patterns, wherein forming the interconnection patterns comprises performing a dry etching process, in which a chlorine-containing gas is used as a source gas, on the conductive layer; and performing a cleaning process on the interconnection patterns, wherein the cleaning process is performed to remove chlorine sources remaining on the interconnection patterns, wherein the cleaning process is performed using a gas mixture of a first gas and a second gas, the first gas contains a water vapor, and the second gas contains a material different from that of the first gas and is reactive to a hydrogen element, wherein at least some of the hydrogen from the first gas reacts with the chlorine sources remaining on the conductive patterns, and wherein a remainder of the hydrogen from the first gas reacts with the second gas.

7. The method of claim 6, wherein a concentration of a hydrogen element (H) in the first gas is higher than that in the second gas.

8. The method of claim 6, wherein the second gas contains at least one of oxygen ($O_2$) or nitrogen ($N_2$).

9. The method of claim 6, wherein a volume ratio of the first gas in the gas mixture ranges from 1% to 25%.

10. The method of claim 6, wherein the cleaning process is a plasma treatment process, wherein the gas mixture of the first and second gases is used as a plasma source.

11. The method of claim 6, further comprising forming bit lines in the interlayer insulating layer, wherein the bit lines are electrically connected to the magnetic tunnel junction patterns, and the interconnection patterns are electrically connected to the magnetic tunnel junction patterns through the bit lines.

12. The method of claim 11, wherein, when viewed in a vertical section, the interconnection patterns are at a higher level than that of the magnetic tunnel junction patterns from the substrate, and the bit lines are positioned between the interconnection patterns and the magnetic tunnel junction patterns.

13. The method of claim 11, further comprising forming selection elements on the substrate, before forming the magnetic tunnel junction patterns,
  wherein the magnetic tunnel junction patterns are electrically connected to the selection elements, and the interlayer insulating layer is formed to cover the selection elements.

14. The method of claim 6, wherein the conductive layer is formed of an aluminum-containing material.

15. The method of claim 6, wherein the second gas is a source gas comprising nitrogen ($N_2$).

* * * * *